(12) United States Patent
Muenzer et al.

(10) Patent No.: US 7,315,439 B2
(45) Date of Patent: Jan. 1, 2008

(54) METHOD AND CIRCUIT ARRANGEMENT FOR LIMITING AN OVERVOLTAGE

(75) Inventors: Mark Muenzer, Soest (DE); Reinhold Bayerer, Warstein (DE); Peter Kanschat, Bad Sassendorf (DE)

(73) Assignee: EUPEC Europaeische Gesellschaft fur Leistungshalbleiter mbH (DE)

( * ) Notice: Subject to any disclaimer, the term of this patent is extended or adjusted under 35 U.S.C. 154(b) by 244 days.

(21) Appl. No.: 10/797,241

(22) Filed: Mar. 10, 2004

(65) Prior Publication Data

US 2004/0169975 A1    Sep. 2, 2004

Related U.S. Application Data

(63) Continuation of application No. PCT/EP03/06700, filed on Jun. 25, 2003.

(30) Foreign Application Priority Data

Jul. 10, 2002    (DE) .................... 102 31 198

(51) Int. Cl.
*H02H 9/04*    (2006.01)
(52) U.S. Cl. ........................... 361/91.1
(58) Field of Classification Search ............. 361/91.1
See application file for complete search history.

(56) References Cited

U.S. PATENT DOCUMENTS

| | | | |
|---|---|---|---|
| 4,679,112 A | 7/1987 | Craig | 361/33 |
| 5,336,985 A * | 8/1994 | McKenzie | 323/266 |
| 5,375,028 A | 12/1994 | Fukunaga | 361/93 |
| 5,650,906 A * | 7/1997 | Marquardt et al. | 361/88 |
| 6,100,742 A * | 8/2000 | Erckert | 327/374 |
| 6,531,908 B1 * | 3/2003 | Goeser et al. | 327/309 |
| 6,825,620 B2 * | 11/2004 | Kuennen et al. | 315/224 |
| 6,861,835 B2 * | 3/2005 | Maly et al. | 324/140 R |

FOREIGN PATENT DOCUMENTS

| | | |
|---|---|---|
| DE | 40 38 199 A1 | 6/1992 |
| DE | 196 40 433 A1 | 4/1998 |
| DE | 197 01 377 A1 | 7/1998 |
| DE | 100 31 778 A1 | 1/2002 |
| WO | WO94/23497 | 10/1994 |

* cited by examiner

*Primary Examiner*—Michael Sherry
*Assistant Examiner*—Lucy Thomas
(74) *Attorney, Agent, or Firm*—Coats & Bennett, P.L.L.C.

(57) ABSTRACT

In order to limit an overvoltage at a parallel circuit of IGBT (3) and freewheeling diode (7), an undesirable current spike is used to switch on the intrinsically turned-off IGBT (3') during the presence of the current spike precisely to an extent such that a current which counteracts the overvoltage arises in the IGBT/freewheeling diode pair. The oppositely acting current reduces the current gradient in leakage inductances ($L_o$) and reduces the undesirable induced overvoltages.

9 Claims, 6 Drawing Sheets

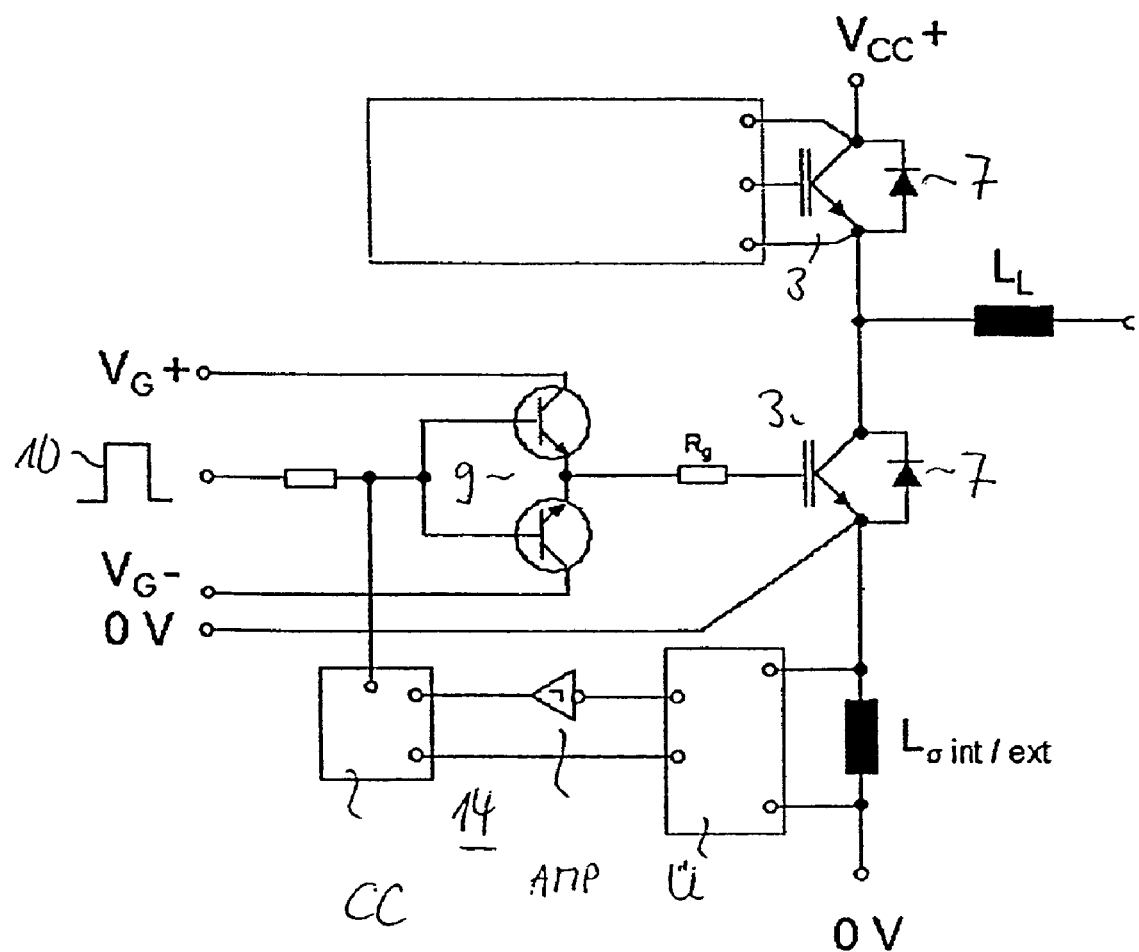

METHOD AND CIRCUIT ARRANGEMENT FOR LIMITING AN OVERVOLTAGE

CROSS REFERENCE TO RELATED APPLICATION

This application is a continuation of copending International Application No. PCT/EP03/006700 filed Jun. 25, 2003 which designates the United States, and claims priority to German application no. 102 31 198.6 filed Jul. 10, 2002.

TECHNICAL FIELD OF THE INVENTION

The present invention relates to a method and a circuit arrangement for limiting an overvoltage which reacts on a load driver as a result of the switching of an inductive load, such as an electric motor, for example.

DESCRIPTION OF THE RELATED ART

If inductive loads are switched, then high inductive back-EMFs arise upon switch-off, and may destroy the load driver. In order to reduce the overvoltages, it is customary to connect so-called freewheeling diodes in parallel with the load driver, which conduct overvoltages or current spikes away from the load drivers.

One application in which an inductive load is controlled is by way of example, a converter circuit which is used to operate an electric motor. FIG. 6 schematically illustrates a known converter circuit. An e.g. three-phase AC voltage of an AC voltage source 1 is firstly rectified by a rectifier stage 2, converted into an AC voltage having a variable output frequency with the aid of load drivers 3 and fed to a load 4 (here a three-phase electric motor M). The signals for generating the output voltage are supplied by a microcontroller 5. These are converted into suitable pulses for driving the load drivers 3 with the aid of gate drivers GD. A basic element of such an arrangement is a half-bridge 6 (illustrated in a manner enclosed by a border in FIG. 6).

In such a converter for electrical drives, the load 4 in the form of an electric motor M has inductive elements. By means of the converter, approximately sinusoidal currents are generated in the three phases of the motor M by pulse-width-modulated switching of load drivers 3. For protection against induced overvoltages, each load driver 3 respectively has a freewheeling diode 7 arranged in parallel with it. On account of the inductive elements in the load 4, the current in this case commutates back and forth between the load driver 3 and the corresponding freewheeling diode 7 within a half-bridge 6 (cf. FIGS. 6 and 7).

Such a half-bridge 6 is illustrated separately in FIG. 7 and has in each case two series-connected load drivers 3 arranged between a supply potential $+V_{cc}$ and a reference-ground potential 0 V. A freewheeling diode 7 is respectively connected in parallel with each load driver. The load 4 is connected to the common terminal of the two load drivers 3. This gives rise to a bridge circuit which allows the load 4 to be driven with an AC voltage.

The supply voltage $V_{cc}$ is buffer-stored in an intermediate circuit capacitor 8, which supplies the supply voltage $V_{cc}$ for all the half-bridges 6. An intermediate circuit is formed by the intermediate circuit capacitor 8 and a half-bridge 6.

In each half-bridge 6, component-internal leakage inductances $L_{o,int}$ and external leakage inductances $L_{o,ext}$ governed by the construction act in addition to inductance of the load 4. The two load drivers 3 are driven such that in each case only one of the two load drivers conducts, while the other is turned off.

FIG. 7 additionally illustrates the basic current profile in a half-bridge 6 upon commutation of a current from the inductive load $L_L$ from the upper freewheeling diode 7 into the lower, switching-on load driver 3 (the load drivers 3 switch alternately; while one is switched on, the other is switched off). Before the switch-on operation, the current Iv freewheeling through the upper freewheeling diode 7 flows through the load $L_L$, the upper freewheeling diode 7 and the two leakage inductances $L_{o,int}$ and $L_{o,ext}$ inherently present. After the conclusion of the commutation operation, i.e. with the lower load driver 3 switched on (switches in a semiconductor embodiment are usually used as load drivers 3 and are therefore also referred to as power semiconductors or semiconductor power switches), the current flows through the load $L_L$ and through the lower load driver 3 and also the lower leakage inductances $L_{o,int}$ and $L_{o,ext}$. The current contribution $I_z$ as a result of the transition of the freewheeling diode 7 from the conducting to the blocking state during the switching operation is depicted in dashed fashion.

This element causes the reverse current spikes shown in FIGS. 8A to 9B. The component-internal and construction-dictated external leakage inductances $L_{o,int}$ and $L_{o,ext}$, respectively, can induce, during the decay of the reverse current spike, an overvoltage greater than the intermediate circuit voltage or supply voltage $V_{cc}$ at the freewheeling diode 7 which, under certain circumstances, exceeds the maximum permissible voltage for the load driver 3 or the freewheeling diode 7 (freewheeling diode 7 may be destroyed).

During the acceptance of the current from the freewheeling diode 7 into the load driver 3, the gradient of the current rise in the load driver 3 is determined by the driving of the load driver 3. In addition to the current from the load $L_L$, a so-called reverse current spike arises, which is governed by the storage charge of the freewheeling diode 7. The additive reverse current spike is fed from the intermediate circuit capacitor 8 and flows via the leakage inductances $L_{o,int}$ and $L_{o,ext}$, respectively, in the intermediate circuit. Said reverse current spike falls more or less rapidly depending on the optimization of the freewheeling diodes 7. Magnitude and rate of decay can be influenced by the gradient di/dt of the current rise in the load driver 3.

Depending on the size of the leakage inductances $L_{o,int}$ and $L_{o,ext}$, in the intermediate circuit and the current gradient di/dt, a voltage dip arises at the half-bridge 6 and the load driver 3 during the rise in the current in the load driver 3, said voltage dip being determined by the law u $(L_o)=L_o * di/dt$. During the decay of the reverse current spike, an opposite voltage arises at said leakage inductances $L_{o,int}$ and $L_{o,ext}$, which voltage generates a voltage spike at the freewheeling diode 7. In the case of freewheeling diodes 7 which effect very rapid chopping, overvoltage spikes up to the destruction limit may arise as a result of high leakage inductances $L_{o,int}$ and $L_{o,ext}$.

FIGS. 8A and 8B schematically illustrate the voltage at the component $V_{ce}$ during the switching operation, the switched load current $I_c$ through the load driver 3 and the gate voltage $V_{GE}$ at the switching load driver 3' (FIG. 8A) and at the freewheeling diode 7 (with the blocking load driver 3" connected in parallel; FIG. 8B).

During switching, the gate voltage $V_{GE}$ at the switching load driver 3' rises from −15 V to +15 V and the voltage $V_{ce}$ at the load driver 3 falls from $+V_{cc}$ (positive potential of the supply voltage or intermediate circuit voltage $V_{cc}$) to approximately 0 V. The current through the load driver (load current $I_c$) rises rapidly and assumes its nominal value $I_c$ after a short current spike.

At the freewheeling diode 7" connected in parallel with the blocking load driver 3", the freewheeling current falls from the nominal value $I_c$ to zero (with a short overshoot or negative current spike; also referred to as reverse current spike). The gate voltage $V_{GE}$ of the turned-off load driver 3" there remains at −15 V, while the voltage $V_{ce}$ at the load driver rises from 0 V to $+V_{cc}$ (likewise with a short, large overshoot; also referred to as overvoltage).

Such commutation operations (current reversal or changeover) also take place in other applications with inductive loads and comparable switching operations (for example in switched-mode power supplies).

In order to protect the freewheeling diodes 7 against such overvoltages, the load driver 3 which controls the commutation operation has been switched more slowly hitherto (at least known in-house), as a result of which the reverse current spike decreases and the freewheeling diode 7 effects less steep chopping (cf. FIGS. 9A and 9B).

FIGS. 9A and 9B illustrate the influencing of overvoltage and reverse current spike by slower switching of the load driver by using a larger gate resistance $R_G$ (FIG. 9A shows the conditions at the switching load driver 3' and FIG. 9B the conditions at the freewheeling diode 7" connected in parallel with the blocking load driver 3"). For comparison purposes, the current/voltage profiles shown in FIGS. 8A and 8B, respectively, are in each case illustrated in dotted fashion. In particular the losses in the switching load driver are significantly increased as a result of this, as can be seen from the current/voltage profiles in FIG. 8A.

It is known—at least in-house—to reduce the effective leakage inductance $L_o$ by means of a so-called snubber circuitry. If the current gradient in the load driver 3 is reduced by slower driving, this leads to increased, unacceptable switching losses in the load driver 3. A snubber circuitry generates increased costs and moreover additional losses in the snubber circuit.

SUMMARY OF THE INVENTION

It is an object of the invention to provide a method and a circuit arrangement for limiting an overvoltage by means of which additional losses are reduced. In particular, the intention is to reduce large overvoltages and reverse current spikes.

This object can be achieved by a method for limiting an overvoltage at a freewheeling device arranged in parallel with a semiconductor power switch, wherein at least a first and a second semiconductor power switch each parallel-connected with a freewheeling device are connected in series, and an output terminal to an inductive load is arranged between the two, the method comprising the steps of:
controlling one of the semiconductor power switches into the turned-off state and the other one into the non-turned-off state,
switching the turned-off semiconductor power switch, at least at the instant of the occurrence of an overvoltage at the associated freewheeling device or during the decay of a current spike, temporarily on to such an extent that a short-time current is generated at the output of the semiconductor power switch.

The semiconductor power switch used can be an IGBT or MOS power transistor, and the gate terminal and the emitter terminal can be connected to one another with high impedance in the case of the intrinsically turned-off IGBT, as a result of which a short-time switch-on of the semiconductor power switch is achieved when a current spike occurs. The control terminal of the turned-off semiconductor power switch may have applied to it a voltage pulse of predetermined duration and amplitude in a manner temporally coordinated with the occurrence of a current spike at the freewheeling device. The control terminal of the turned-off semiconductor power switch may have applied to it a stepped voltage pulse of predetermined short time duration in a manner temporally coordinated with the occurrence of a current spike. The voltage at the freewheeling device can be fed back via a feedback path to the control terminal of the turned-off semiconductor power switch, as a result of which the turned-off semiconductor power switch is momentarily and at least partially switched on during the voltage spike. The current gradient in the freewheeling device can be fed back via a further feedback path to the control terminal of the turned-off semiconductor power switch in such a way that the turned-off semiconductor switch is momentarily and at least partially switched on during the current spike.

The object can also be achieved by a circuit arrangement for limiting an overvoltage at a freewheeling device arranged in parallel with a semiconductor power switch, comprising at least a first and a second semiconductor power switch each parallel-connected with a freewheeling device being connected in series, an output terminal arranged between the first and second semiconductor power switch for coupling with to an inductive load, and a feedback path between the output of each semiconductor power switch and its control terminal.

The feedback path may have at least one component, which permits a driving of the control terminal only above a threshold voltage, so that only voltages greater than a predetermined threshold value are fed back to the control terminal. The feedback path may have a component, via which a feedback to the control terminal is effected in a manner proportional to the voltage rise at the freewheeling device. Two zener diodes connected in antiparallel can be used as the components in the feedback path. A capacitor can be used as the component in the feedback path. A parallel circuit comprising zener diodes and an external capacitor can be used in the feedback path.

The object can furthermore be achieved by a circuit arrangement for limiting an overvoltage at a freewheeling device arranged in parallel with a semiconductor power switch, comprising at least a first and a second semiconductor power switch each parallel-connected with a freewheeling device being connected in series, an output terminal arranged between the first and second semiconductor power switch for coupling with to an inductive load, wherein a feedback path is provided between the input and control terminal of a power driver, the feedback path being designed such that it permits the control terminal to be driven up only above a threshold value of the current gradient through the freewheeling device.

The voltage drop across internal and/or external leakage inductances can be utilized for the feedback. The current rise can be fed back through the induction in a transformer.

In all embodiments, an IGBT power transistor can be used as the semiconductor power switch.

In this case, a (semiconductor) power switch (referred to hereinafter as load driver) connected in parallel with a freewheeling diode is utilized as a limiter for the (over)voltage present at the freewheeling diode during the commutation. The limiting of the overvoltage by a load driver connected in parallel therewith is achieved by virtue of the fact that said load driver, during the decay of a reverse current spike, is switched on momentarily, precisely to an extent such that an additive falling current arises in the semiconductor switch/freewheeling diode pair. The additive falling current thus reduces the current gradient in leakage inductances governed by circuit construction and reduces the induced voltages. The short-time switch-on is temporally coordinated with the occurrence of the reverse current spike.

Thus, the semiconductor switches used may be so-called IGBTs, in the case of which the control terminal and the output terminal of the turned-off semiconductor switch are connected to one another with high impedance, as a result of which a short-time switch-on of the semiconductor switch is achieved upon the occurrence of a current spike. This represents a very simple possibility for counteracting the voltage spike to a certain extent.

It is also advantageous for the control terminal of the turned-off semiconductor switch to have applied to it an approximately rectangular-waveform voltage pulse of predetermined duration and an amplitude less than a predetermined threshold value during the occurrence of a current spike or at least during the decay of the current spike.

It is even more advantageous to use a stepped voltage pulse instead of a simple rectangular pulse, the largest amplitude momentarily being present at least during the decay of the reverse current spike in order to counteract said reverse current spike.

The voltage at the output terminal of the other, turned-off semiconductor switch may additionally (or else solely) be fed back via a feedback path to its control terminal. As a result, the turned-off semiconductor switch is momentarily switched on during the presence of the current spike or inductive overvoltage. This reduces the current gradient in the fall of the current spike and thus the overvoltage.

This effect may also be increased if—in addition to the feedback the control terminal of the semiconductor switch has a voltage pulse applied to it during the presence or decay of the current spike, as a result of which the actually turned-off semiconductor switch is partially switched on.

The feedback path advantageously has at least one such component by means of which the feedback path is activated only when the voltage exceeds a threshold value. Two zener diodes connected in antiseries may thus be used for this purpose. What is thereby achieved is that it is only when a predetermined voltage is exceeded that a driving and thus a partial switch-on of the intrinsically turned-off semiconductor switch is achieved, this being achieved in a manner temporally coordinated with the occurrence of the overvoltage. As an alternative or in supplementary fashion, the voltage rise at the freewheeling device may be fed back to the control terminal of the load driver e.g. with the aid of a capacitor. As a result of this, the commutation operation is influenced in such a way that the magnitude and gradient of the reverse current spike decrease. Consequently, simple cost-effective means enable an effective reduction of an inductive overvoltage and the reduction of harmful current spikes with a large current gradient. Moreover, the driving of the semiconductor switch that counteracts the overvoltage or the reverse current spike is geared temporally to the presence of the reverse current spike. The threshold starting from which the feedback is to be activated can also be set in a simple manner through corresponding dimensioning of the components in the feedback path.

BRIEF DESCRIPTION OF THE DRAWINGS

Exemplary embodiments of the invention are explained in more detail below with reference to the schematic drawings, in which:

FIG. 3B shows a further exemplary embodiment of a circuit arrangement according to the invention with a feedback path for a signal proportional to the current gradient diode.

DETAILED DESCRIPTION OF THE PREFERRED EMBODIMENTS

Figure 1A:
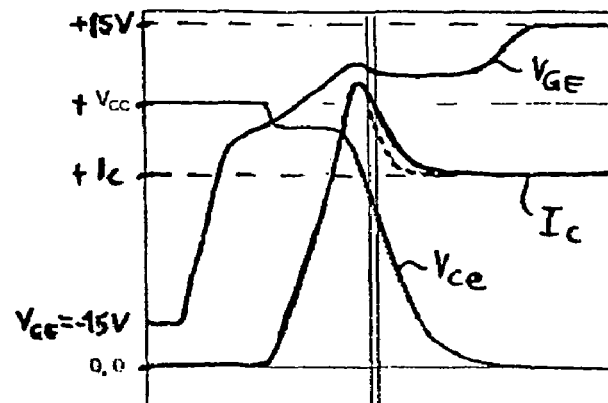
FIGS. 1A and 1B show current/voltage profiles at a switching-on semiconductor switch and at a freewheeling diode connected in parallel with a blocking semiconductor switch, respectively.

Functionally identical parts have been given identical reference symbols in the figures and the exemplary embodiments.

For the control or switching of inductive loads $L_L$, such as, for example, an electric motor (cf. FIG. 6), power semiconductor components (referred to as power switches, as load drivers 3 or else as semiconductor switches) are often used as drivers. The load drivers 3 themselves are usually controlled by a control unit with a microcontroller 5. Since undesirable, high voltages are induced when inductive loads $L_L$ are switched, in particular when the loads $L_L$ are switched off, a freewheeling diode 7 is respectively connected in parallel with each load driver 3, and is intended to reduce an induced overvoltage.

It is customary to use a half-bridge 6 for controlling an inductive load $L_L$, two load drivers 3 with freewheeling diodes 7 in each case connected in parallel being connected in series and switching alternately (the switched-on load driver is designated by 3' and the turned-off load driver is designated by 3"). The output terminal for an inductive load $L_L$ is arranged between the two load drivers 3.

Figure 2:
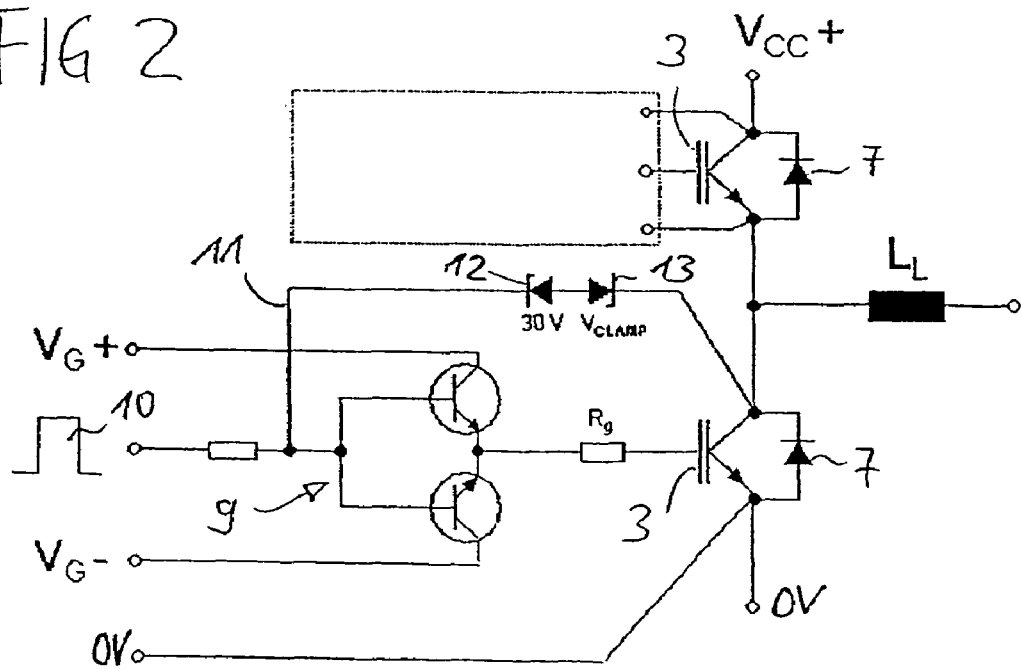
FIG. 2 shows a first exemplary embodiment of a circuit arrangement according to the invention with a feedback path having zener diodes.
Figure 6:
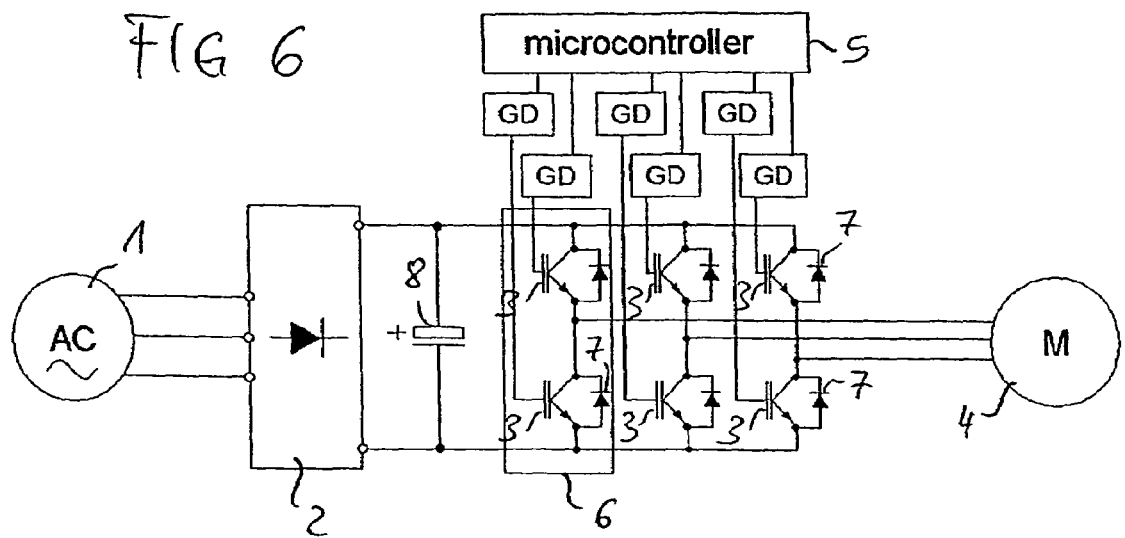
FIG. 6 shows a known converter circuit for controlling a three-phase electric motor.
Figure 7:
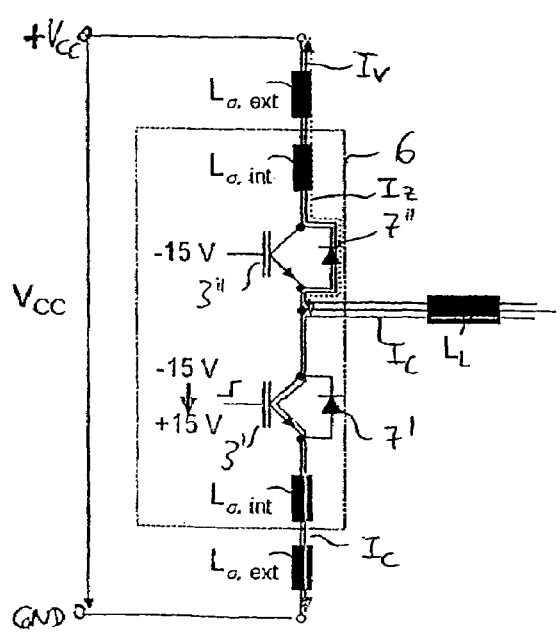
FIG. 7 shows a half-bridge of the known converter circuit in accordance with FIG. 5 with the electric currents that occur therein.

In this case, two IGBT power transistors are used as load drivers 3 (cf. FIG. 2, where a complete half-bridge 6 is illustrated). Arranged upstream of the control terminal (gate) of each IGBT is a gate series resistor Rg and upstream of that an output amplifier stage of a gate driver GD (cf. FIG. 6). One possible embodiment of such an output amplifier stage is the emitter follower circuit shown in 9 (FIG. 2, FIG. 3, circuit part 9). The gate driver GD, for its part, is connected to a microcontroller 5—as illustrated in FIG. 6. The output amplifier stage 9 of the gate driver GD is supplied with a positive supply voltage $V_{G+}$ and a negative supply voltage $V_{G-}$ and has a control signal $V_{gatedrive}$ applied to it via a common control terminal (also cf. FIG. 4). Said control signal $V_{gatedrive}$ is finally switched through to the gate of the IGBT.

The half-bridge 6 is usually designed as an integrated component. As a result of component—internal leakage inductances $L_{o,int}$ and external leakage inductances $L_{o,ext}$ governed by the circuit construction, during the decay of a reverse current spike caused during switching, there may be induced at the freewheeling diode 7 overvoltages (voltage greater than the supply voltage $V_{cc}$ of the half-bridge 6), which, under certain circumstances, exceed the maximum permissible voltage for the components used. The intention is now to reduce said overvoltage (or a current spike having a large current gradient di/dt or a steep voltage rise du/dt) induced during the switching of the load drivers 3 on account of inductances situated in the electric circuit.

According to the invention, the load driver 3 (IGBT) connected in parallel with the freewheeling diode 7 is utilized as a limiter for the overvoltage at the freewheeling diode 7 during the changeover. The limiting of the overvoltage by the load driver 3 connected in parallel is achieved by virtue of the fact that said load driver 3, in a targeted manner during the decay of a reverse current spike, is switched on momentarily, precisely to an extent such that an additive falling current arises in the load driver/freewheeling diode pair. The additive falling current counteracts the induced current spike and thus reduces the current gradient in the leakage inductances $L_{o,int}$ and $L_{o,ext}$. Consequently, the induced overvoltage also turns out to be lower.

The gate and the emitter of the IGBT are connected to one another with high impedance in the switched-off state of the IGBT. This brings about the desired short-time switch-on of the IGBT if the freewheeling diode 7 connected in parallel is commutated, because the chopping of the freewheeling diode current also effects, in addition to the high current gradient di/dt, a steep voltage rise du/dt at the freewheeling diode 7 and the parallel IGBT.

The voltage rise du/dt leads via the so-called Miller capacitance in the IGBT to a rise in the gate voltage $V_{GE}$, which is reduced only slowly on account of the high-impedance gate-emitter connection. As a result of this, the IGBT is partially switched on for the duration of the voltage rise du/dt. This in turn reduces the voltage rise du/dt, the IGBT switches off again and overall is loaded only slightly with current (cf. associated current/voltage profiles in FIGS. 1A and 1B).

Figure 1B:
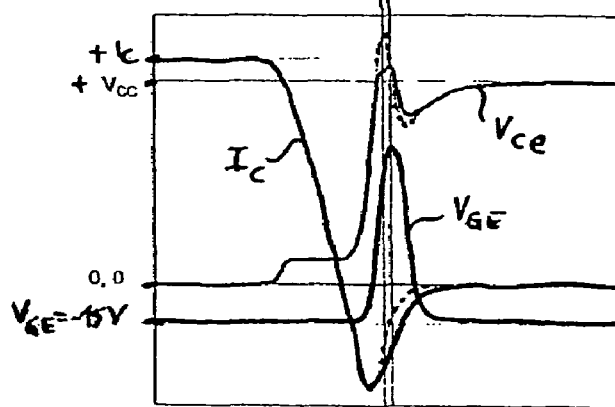

The results of the influencing of overvoltages and reverse current spike by the short-time switch-on of the IGBT (load driver 3") connected in parallel with the freewheeling diode 7" are illustrated by the current/voltage profiles in FIGS. 1A and 1B. In this case, the current/voltage profiles at a switching-on IGBT (load driver 3') are illustrated in FIG. 1A and the current/voltage profiles at a freewheeling diode 7" connected in parallel with the other, blocking IGBT (load driver 3") are illustrated in FIG. 1B.

If the gate voltage $V_{GE}$ of the non-switched (of the, as it were, turned-off) IGBT is momentarily switched on, then the gate voltage $V_{GE}$ increases in pulsed fashion within a short time duration. This leads to a significant reduction of the excessive voltage increase of the intermediate circuit voltage or supply voltage $V_{cc}$ in comparison with the prior art (current/voltage conditions of the prior art are illustrated in dotted fashion; cf. FIGS. 8A and 8B). Moreover, the current gradient decreases, di/dt of the switched load current $I_c$ decreases, which leads to more switching losses, however.

As becomes clear from the comparison of the dotted and solid current curves of the load current $I_c$ in FIGS. 1A and 1B, however, the switching losses are only increased marginally as a result of this. The losses in the momentarily switched-on IGBT are negligible on account of the small switched current.

In order to reduce the current gradient or the overvoltage more significantly, a feedback path 11 (FIG. 2) may be provided for each pair of IGBT/freewheeling diodes 3, 7, which feedback path feeds the voltage at the cathode of the freewheeling diode 7" (or at the collector of the IGBT) back to the control input of the IGBT (the control signal $V_{gatedrive}$, which is present at the output amplifier stage 9 of the gate driver GD, is influenced), as a result of which the intrinsically turned-off IGBT is switched on momentarily.

Zener diodes (in the exemplary embodiment according to FIG. 2 a 30 V zener diode 12 connected in series in an antiparallel manner with respect to a clamping zener diode 13) may advantageously be arranged in the feedback path 11. These diodes have the effect that it is only when a defined overvoltage is reached at the freewheeling diode 7" that a switch-on of the intrinsically turned-off IGBT connected in parallel therewith is triggered (a so-called overvoltage clamping).

With the aid of the zener diodes 12, 13, a short-time at least partial switch-on of the IGBT can be effected upon reaching an overvoltage greater than the clamping voltage by feedback into the output amplifier stage 9 of the gate driver GD and thus an influencing of the control signal $V_{gatedrive}$.

In contrast to a direct feedback to the gate terminal of the IGBT, the zener diodes are loaded with significantly lower currents in the case of this circuitry. In this way, it is possible to obtain a similar switching behavior to that already illustrated by the current/voltage profiles in FIGS. 1A and 1B.

Figure 3A:
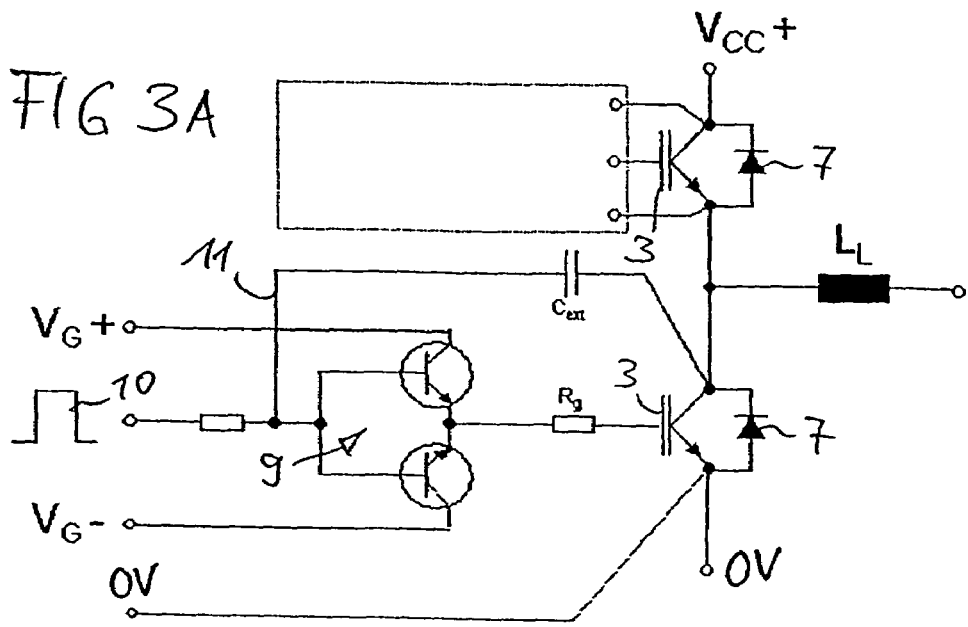
FIG. 3A shows a further exemplary embodiment of a circuit arrangement according to the invention with a feedback path having a separate capacitor.

Instead of the two zener diodes 12, 13, an external capacitor $C_{ext}$ may also be used in the feedback path 11, as is illustrated in FIG. 3A. In this case, the rise in the cathode voltage of the freewheeling diode 7" is fed back to the control terminal of the IGBT connected in parallel with the freewheeling diode 7", as a result of which the IGBT is momentarily and at least partially switched on, which counteracts the excessive voltage increase and the reverse current spike.

The combination of the two last-mentioned measures may also advantageously be used; thus, with the aid of an external capacitor $C_{ext}$ in the feedback path 11, the control terminal of the power driver can be biased to a voltage below the switch-on voltage during the voltage rise at the freewheeling device. In this case, the parallel-connected feedback takes place in a manner significantly freer of inertia when a threshold voltage is exceeded (e.g. via the zener diode circuit described), since a smaller voltage swing has to be overcome by the switch-on operation of the load driver.

In a similar manner, a control signal proportional to the magnitude of the current gradient in the freewheeling device may also be fed back to the control terminal of the load driver via a feedback path 14 (for example by means of a transformer Ü an amplifier AMP and also an evaluation circuit CC) (FIG. 3B). The current gradient during the fall in the current in the freewheeling device after the maximum of the reverse current spike has been exceeded is fed back to the control terminal of the load driver, so that the latter momentarily at least partially turns on and limits the current fall in the reverse current spike. This measure may be combined with the above-described or one of the below-described measures for biasing the control terminal of the load driver. In this way, the overvoltage at the freewheeling device can be reduced by simple means.

Given suitable dimensioning, it is possible to utilize the current gradient in the freewheeling device before the maximum of the reverse current spike is reached, in order to bias the control terminal of the load driver to a voltage below the switch-on threshold. This method affords the advantage that the raising of the control voltage at the load driver is effected automatically in synchronism with the commutation operation.

In the simplest case, the current gradient may be detected as a voltage drop across the leakage inductances $L_{o,int}$, $L_{o,ext}$. To an extent, a transformer-based detection or the detection and evaluation of the current by means of suitable sensors is possible. In this case, the change in sign of the current gradient necessitates, if appropriate, a rectification or evaluation of the signal in a case discrimination dI/dt><0.

As a result of this, the gradient of the voltage rise at the freewheeling diode 7" can be controlled in a targeted manner and the profile of the reverse current spike and, consequently, also the overvoltage can be set. The size of the set voltage rise du/dt is set by the systematic choice of the capacitance of the capacitor $C_{ext}$ and—in contrast to the first exemplary embodiment—does not depend on the value of the Miller capacitance which is altered during the switching operation. In this way, it is possible to bring about a switching behavior similar to that already illustrated by the current/voltage profiles in FIGS. 1A and 1B.

Instead of the feedback path 11 or else in addition to the feedback path 11 between (cathode of the) freewheeling diode 7 and control terminal of the IGBT, it is also possible to perform a targeted driving performed at the instant of the switching operation—of the IGBT by means of the control signal $V_{gatedrive}$. In this case, the IGBT connected in parallel with the freewheeling diode 7" is turned on (at least partially switched on) in a targeted manner by a control signal $V_{gatedrive}$ (FIG. 4), dependent on the instant of the reverse current spike at the freewheeling diode 7", within a specific time window during the commutation phase and is subsequently switched off again (turned off), and this at an instant at which the control signal $V_{gatedrive}$, which actually effects load control, is not provided for this IGBT.

The control signal $V_{gatedrive}$ which is temporally coordinated with the reverse current spike momentarily raises the gate voltage $V_{GE}$ at the IGBT connected in parallel with the freewheeling diode 7", said IGBT being intrinsically turned off, in a targeted manner during the commutation operation. As a result, the IGBT is at least partially activated.

Figure 4:
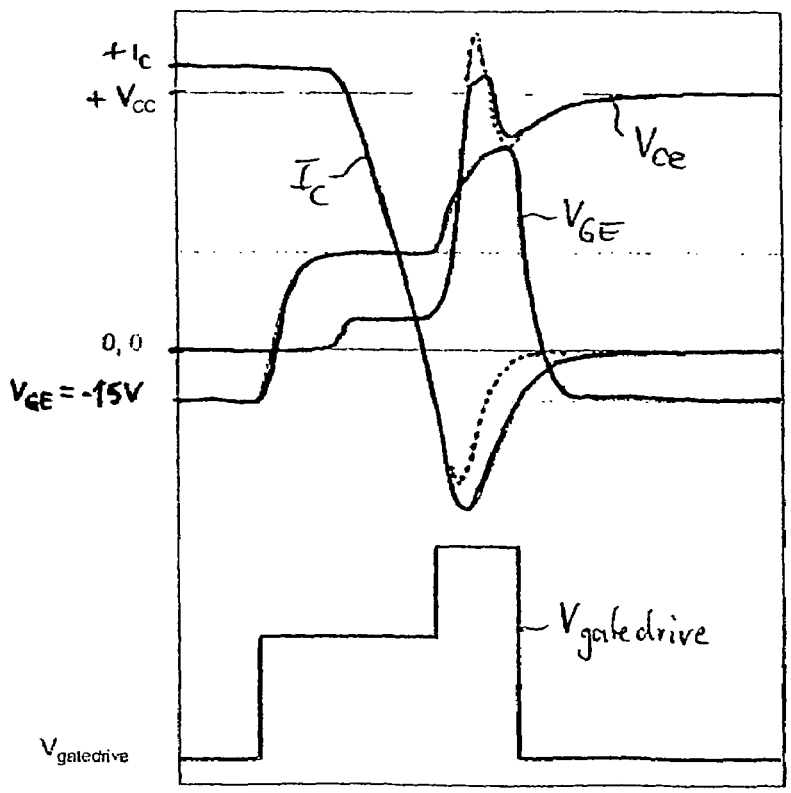
FIGS. 4 and 5 show current/voltage profiles at a switching-on semiconductor switch in accordance with two exemplary embodiments of a method according to the invention.
Figure 8A:
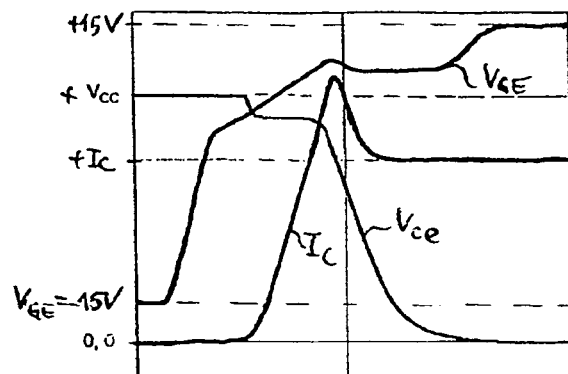
FIGS. 8A and 8B show current/voltage profiles at a switching-on semiconductor switch of the half-bridge according to FIG. 6, and FIGS. 9A and 9B show current/voltage profiles at a switching-on semiconductor switch of the half-bridge according to FIG. 6 with the use of a larger gate resistance.
Figure 8B:
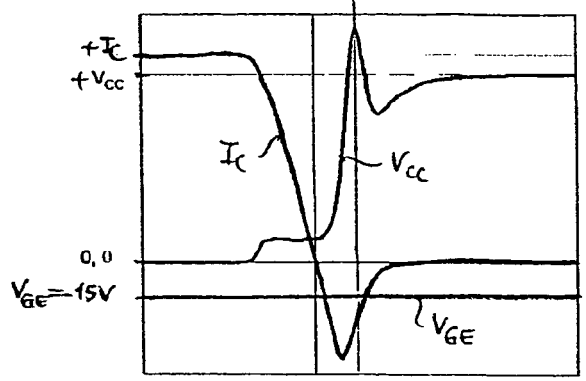
Figure 9A:
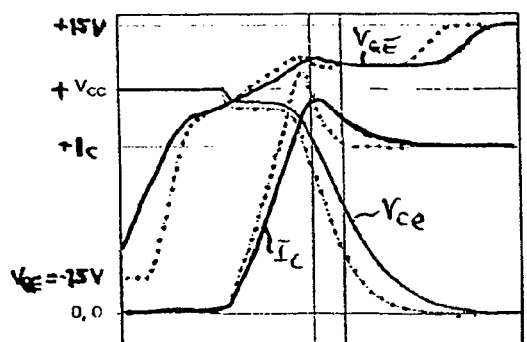
Figure 9B:
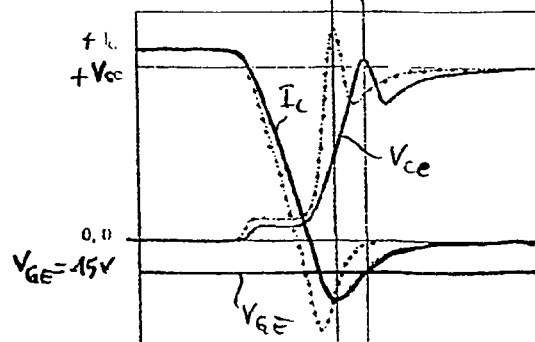

The current/voltage conditions in the case of such driving are represented by way of example in the upper part of FIG. 4 in a comparison with the profile from FIGS. 8A and 8B, which is illustrated in dotted fashion in FIG. 4. The load current $I_c$ decreases when the IGBT is turned off, and has, in the negative range, a spike or excessive increase with a smaller current gradient di/dt in comparison with the current profile as results from the prior art (current profile of the load current 11 illustrated in dotted fashion). The intermediate circuit voltage $V_{cc}$ exhibits a significantly smaller overshoot or lower overvoltage (smaller spike) since the turn-on of the IGBT counteracts the overvoltage in a targeted manner.

Figure 5:
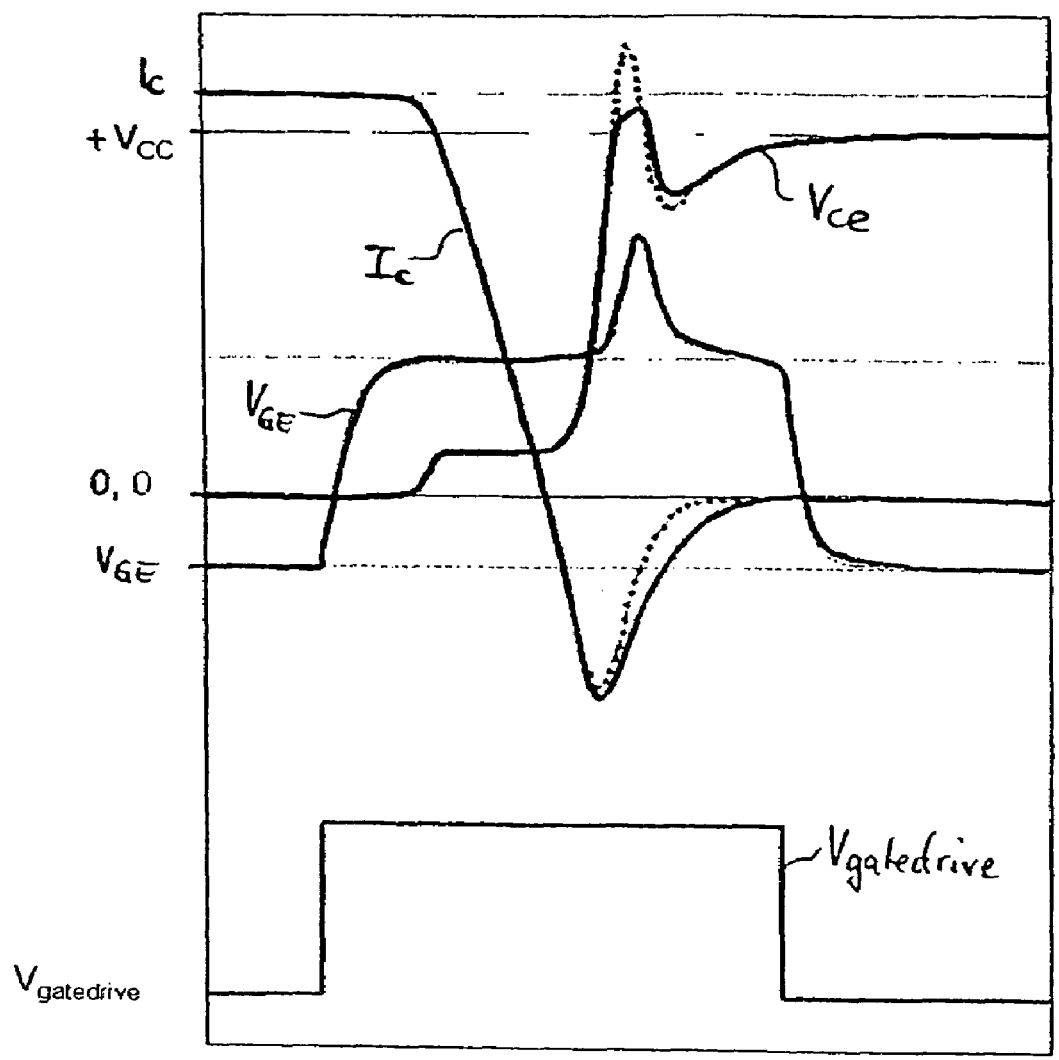

Instead of a stepped control signal $V_{gatedrive}$ and an associated short-time additional increase in the gate voltage $V_{GE}$, it is also possible to provide a rectangular-waveform control signal $V_{gatedrive}$ and an associated, on average, higher gate voltage $V_{GE}$ (FIG. 5) in comparison with the gate voltage $V_{GE}$ from FIG. 4. The gate voltage $V_{GE}$ at the actually blocking IGBT connected in parallel with the freewheeling diode 7" is raised to a value less than a threshold voltage during the commutation of the current from the freewheeling diode 7 in a predetermined, short time window during a reverse current spike of the load current $I_c$ at the freewheeling diode 7.

In a manner similar to that in the first exemplary embodiment, it is possible here, too, without, a high-impedance gate-emitter connection, to effect a switch-on as a consequence of the voltage rise du/dt at the freewheeling diode 7 and the feedback capacitance (capacitor $C_{ext}$).

An advantage of this method is that the voltage interval until the switch-on of the IGBT is reduced and it is thus possible to minimize the delay time until the feedback of the voltage rise du/dt takes effect.

The control signal $V_{gatedrive}$ which is temporally coordinated with the reverse current spike raises the voltage at the IGBT in parallel with the freewheeling diode 7" in a specific time window. This enables e.g. an at least partial turn-on of the IGBT through the feedback capacitance. The resulting switching behavior (current/voltage profile) is illustrated in the upper part of FIG. 5 in a comparison with the behavior from FIGS. 8A and 8B.

The gate voltage $V_{GE}$ is increased by the driving of constant magnitude to a lesser extent than in the previous exemplary embodiment. However, the collector voltage $V_{ce}$/voltage at the freewheeling direction behaves in a manner similar to that in the previous exemplary embodiment, while the current gradient di/dt of the load current $I_c$ is reduced somewhat less, but the reverse current spike is still significantly less steep than the comparable reverse current spike in the case of the prior art (cf. dotted line for the load current $I_c$ in FIG. 5).

In order to limit the voltage at the freewheeling diode 7 during changeover operations, it is also possible to combine circuit arrangements with a feedback path 11 with additional, targeted control of the gate voltage $V_{GE}$ of the IGBT. Equally, it is possible to combine the high-impedance connection of the gate and emitter of the IGBT in the off state as is explained in the first exemplary embodiment—with a feedback path 11 or a targeted, short-time driving of the gate voltage $V_{GE}$. This results in a simple and effective reduction of the overvoltage and/or of the reverse current spike at the freewheeling diode 7. The freewheeling diodes 7 are thus largely protected against destruction.

Freewheeling diodes for limiting an inductive overvoltage are sufficiently known. Equally, functionally equivalent freewheeling devices are known which are not necessarily effective with only a single diode connected in parallel with a power switch. For the invention, it is unimportant whether a freewheeling diode or an equivalent means is used as the freewheeling device. What is essential, by contrast, is that an inductive overvoltage and a large current gradient are reduced in accordance with the method according to the invention or with the circuit arrangement according to the invention.

We claim:

1. A method for limiting an overvoltage at a freewheeling device arranged in parallel with a semiconductor power switch, with at least a first and a second semiconductor power switch each parallel-connected with a freewheeling device being connected in series, and with an output terminal arranged between the first and second semiconductor power switch for coupling to an inductive load, the method comprising the steps of:

providing a feedback path between output and control terminals of the semiconductor power switch, the feedback path comprising a transformer in series with an amplifier connected to a common input of a push-pull stage of a gate driver connected to the control terminal controlling one of the semiconductor power switches into the turned-off state and the other one into the non-turned-off state, and switching the turned-off semiconductor power switch, at least at the instant of the occurrence of an overvoltage at the associated freewheeling device or during the decay of a current spike, temporarily on to such an extent that a short-time current is generated at the output of the semiconductor power switch.

2. The method as claimed in claim 1, wherein the semiconductor power switch used is an IGBT or MOS power transistor, and the gate terminal and the emitter terminal are connected to one another with high impedance in the case of the intrinsically turned-off IGBT, as a result of which a short-time switch-on of the semiconductor power switch is achieved when a current spike occurs.

3. The method as claimed in claim 1, wherein the control terminal of the turned-off semiconductor power switch has applied to it a voltage pulse of predetermined duration and amplitude in a manner temporally coordinated with the occurrence of a current spike at the freewheeling device.

4. The method as claimed in claim 1, wherein the control terminal of the turned-off semiconductor power switch has applied to it a stepped voltage pulse of predetermined short time duration in a manner temporally coordinated with the occurrence of a current spike.

5. The method as claimed in claim 1, wherein the voltage at the freewheeling device is fed back via the feedback path to the control terminal of the turned-off semiconductor power switch, as a result of which the turned-off semiconductor power switch is momentarily and at least partially switched on during the voltage spike.

6. The method as claimed in claim 1, wherein the a current gradient in the freewheeling device is fed back via the feedback path to the control terminal of the turned-off semiconductor power switch in such a way that the turned-off semiconductor switch is momentarily and at least partially switched on during the current spike.

7. A circuit arrangement for limiting an overvoltage at a freewheeling device arranged in parallel with a semiconductor power switch, comprising at least a first and a second semiconductor power switch each parallel-connected with a freewheeling device being connected in series, an output terminal arranged between the first and second semiconductor power switch for coupling to an inductive load, wherein a feedback path is provided between output and control terminals of the semiconductor power switch, the feedback path comprising a transformer in series with an amplifier connected to a common input of a push-pull stage of a gate driver connected to the control terminal wherein a voltage drop across internal and/or external leakage inductances which are coupled in series with said first and/or second semiconductor switch is utilized for the feedback.

8. The circuit arrangement as claimed in claim 7, wherein a current rise is fed back through the induction in a transformer.

9. The circuit arrangement as claimed in claim 7, wherein an IGBT power transistor is used as the semiconductor power switch.

* * * * *

UNITED STATES PATENT AND TRADEMARK OFFICE
CERTIFICATE OF CORRECTION

| | | |
|---|---|---|
| PATENT NO. | : 7,315,439 B2 | Page 1 of 1 |
| APPLICATION NO. | : 10/797241 | |
| DATED | : January 1, 2008 | |
| INVENTOR(S) | : Mark Muenzer, Reinhold Bayerer and Peter Kanschat | |

It is certified that error appears in the above-identified patent and that said Letters Patent is hereby corrected as shown below:

On the cover page the Assignee information should be as follows:
-- (73) Assignee: EUPEC ~~Europaeische~~ Europaische Gesellschaft fur Leistungshalbleiter ~~mbH~~ GmbH & Co. KG --

On the cover page the Foreign Application Priority Data should be as follows:
-- Jul. 10, 2002 (DE) .......................................... 102 31 198.6 ~~102 31 198~~

In the claims, column 10, line 67 should be as follows:
-- stage of a gate driver connected to the control terminal; --

In the claims, column 12, line 2 should be as follows:
-- wherein the ~~a~~ current gradient in the freewheeling device --

Signed and Sealed this

Second Day of September, 2008

JON W. DUDAS
*Director of the United States Patent and Trademark Office*